(12) United States Patent
Haeberlen

(10) Patent No.: US 7,224,043 B2
(45) Date of Patent: May 29, 2007

(54) SEMICONDUCTOR ELEMENT WITH IMPROVED ADHESION CHARACTERISTICS OF THE NON-METALLIC SURFACES

(75) Inventor: Oliver Haeberlen, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/922,240

(22) Filed: Aug. 19, 2004

(65) Prior Publication Data

US 2005/0082688 A1    Apr. 21, 2005

(30) Foreign Application Priority Data

Aug. 19, 2003   (DE)   ............................... 103 38 078

(51) Int. Cl.
*H01L 29/06*   (2006.01)
(52) U.S. Cl. ....................... 257/622; 257/623
(58) Field of Classification Search ................ 257/622, 257/623
See application file for complete search history.

(56) References Cited

U.S. PATENT DOCUMENTS

| 4,712,129 | A |   | 12/1987 | Orcutt |          |
|-----------|---|---|---------|--------|----------|
| 4,884,124 | A | * | 11/1989 | Mori et al. | 257/783 |
| 4,909,960 | A | * | 3/1990  | Watanabe et al. | 252/511 |
| 5,242,862 | A | * | 9/1993  | Okabe et al. | 438/268 |
| 5,981,085 | A | * | 11/1999 | Ninomiya et al. | 428/614 |
| 6,071,201 | A | * | 6/2000  | Maruko | 473/373 |
| 6,323,438 | B1 | * | 11/2001 | Ito | 174/261 |
| 2001/0040291 | A1 | * | 11/2001 | Hashimoto | 257/739 |
| 2004/0009683 | A1 | * | 1/2004 | Hiraoka et al. | 439/75 |
| 2005/0146838 | A1 | * | 7/2005 | Shioga et al. | 361/306.3 |

FOREIGN PATENT DOCUMENTS

| DE | 195 09 262 C2 |   | 9/1996 |
|----|---------------|---|--------|
| DE | 196 34 845 C1 |   | 2/1998 |
| JP | 4-155852      | * | 5/1992 |
| JP | 05063112 A    |   | 3/1993 |

OTHER PUBLICATIONS

Seeger, K. and R.E. Palmer. "Fabrication of Silicon Cones and Pillars Using Rough Metal Films as Plasma Etching Masks." *Applied Physics Letters*. vol. 74, No. 11. (1999): pp. 1627-1629.

* cited by examiner

*Primary Examiner*—Ngân V. Ngô
(74) *Attorney, Agent, or Firm*—Maginot Moore & Beck

(57) ABSTRACT

The invention relates to a semiconductor element with metallic and non-metallic surfaces, with the non-metallic surfaces of the semiconductor being provided with a layer which has irregularities, so that adhesion between the non-metallic surface and the molding compound is thus increased.

15 Claims, 3 Drawing Sheets

SEMICONDUCTOR ELEMENT WITH IMPROVED ADHESION CHARACTERISTICS OF THE NON-METALLIC SURFACES

FIELD OF THE INVENTION

The present invention relates to the field of semiconductor technology, and in particular to the field of semiconductor elements which have to be provided with a housing.

BACKGROUND

A semiconductor element has to satisfy a large number of requirements, and has to have a certain minimum life. However, semiconductor elements are generally highly sensitive, so that environmental influences can adversely affect the operation of an element such as this, and can considerably shorten its life. Once a semiconductor element has been produced, it is therefore generally fitted with a housing in order to protect the semiconductor element against environmental influences. The housing which is generally used in semiconductor technology is generally in form of a molding compound composed of organic polymers (typically thermosetting plastics based on epoxy resins such as Orthocresolnovolac), which are applied to the semiconductor element by extrusion coating. A semiconductor element which has been packed in this way is subjected after its production to further process steps, with the various process steps being carried out at different temperatures, so that a semiconductor element such as this is repeatedly subjected to temperature loads. In order to make it possible to effectively protect the semiconductor element against the environmental influences, a housing must be in close contact with the semiconductor element in widely different conditions, and it must not have any tendency to separation. It is thus necessary for the adhesion of the molding compound to all of the exposed surfaces of the semiconductor element (or the chip) to be set such that no separation (delamination) occurs in repeatedly changing temperature conditions. A semiconductor element is generally composed of metallic and non-metallic parts, which have different adhesion characteristics with respect to the molding compound. Both the metallic surfaces and the non-metallic surfaces must therefore be prepared in separate steps, so as to ensure the adhesion to the molding compound.

In order to improve the adhesion between the metallic surfaces and the housing, a further, suitably, roughened metallic layer is deposited on all of the metallic surfaces which are in contact with the molding compound, before the production of the housing. Electrochemical deposition is particularly suitable for deposition of this metallic layer, in order to make it possible to deposit filaments in the nanometer range, which considerably improves the adhesion between the metallic surface and the molding compound.

A layer composed of a polyimide polymer is applied to the non-metallic surfaces in order to improve the adhesion of the non-metallic surfaces of a semiconductor element to the molding compound. However, since the adhesion between the metallic surface and the polyimide polymer is not optimal, a further layer, which is referred to in the following text as a passivation layer, must be applied underneath the polyimide polymer. This passivation layer, which improves the adhesion between the polyimide and the metallic surfaces, is preferably composed of a dielectric, such as silicon nitride or silicon oxide.

The object of the present invention is to provide a semiconductor element which can be provided with a housing without having to apply a passivation layer to the non-metallic surfaces.

SUMMARY

The object of the invention is achieved in that, in the case of a semiconductor element with metallic and non-metallic surfaces, the non-metallic surfaces of the semiconductor are provided with a layer which has irregularities, so that adhesion between the non-metallic surface and the molding compound is thus increased. The irregularities for the purposes of the invention comprise all discrepancies from the smooth surface structure, and may have any desired form. The discrepancies from the surface structure may, however, also occur at regular intervals on the surface.

These irregularities result in roughening of the smooth surfaces, thus increasing their adhesion to the molding compound.

The roughening of the non-metallic surfaces results in two different surface structures for adhesion of the process compound, specifically a metallization layer, which is preferably applied to the metallic surfaces by means of electrochemical treatment, in order to deposit nanofilaments for example, and the non-metallic layers, which have a layer which is provided with irregularities. Both layers have excellent adhesion to the molding compound, so that there is no need for a passivation layer.

It has been found that the best results are achieved when the irregularities are in the form of pointed depressions. The microroughness which is achieved in this way has a clawlike structure, so that the bonding between the molding compound and the non-metallic surfaces is strong enough, and delamination cannot occur.

The distance between two adjacent depressions is in the range between 1 and 30 nanometers, preferably between 2 and 10 nanometers. The depth of the depressions is in the range between 10 and 80 nanometers, preferably between 5 and 40 nanometers.

The irregularities on the non-metallic surface may have any desired form provided that this form achieves roughness on the surface, thus improving the adhesion between the molding compound and the non-metallic surfaces. The irregularities may, for example, be in the form of holes in the surface, or may have a different stamped pattern.

The layer which has the irregularities may be in the form of a separate layer on the non-metallic surfaces, or may be a component of the non-metallic surfaces.

The microroughess of the non-metallic surfaces is preferably produced using the method described in the following text.

In the method for production of the irregularities in the non-metallic surfaces, the non-metallic surface is covered with particles which have a granularity in the nanometer range, so that the particles protect the surface located underneath them, thus resulting in the production of microroughness.

The particles which have granularity in the nanometer range are preferably produced during anisotropic plasma etching of the non-metallic surface, in the presence of adjacent exposed metallic surfaces at the same time. If, for example, the metallic surface is composed of aluminum, this leaves aluminum particles whose size is in the nanometer range being sputtered off during the oxide etching process, being deposited on adjacent oxide surfaces, and masking the further oxide etching at these points (micromasking). However, this is only one possible way to mask the surface with nanoparticles, since there are a number of ways to deposit the particles on the surface.

BRIEF DESCRIPTION OF THE DRAWINGS

The invention will be described in more detail in the following text with reference to the following figures, in which.

DETAILED DESCRIPTION

Figure 1:
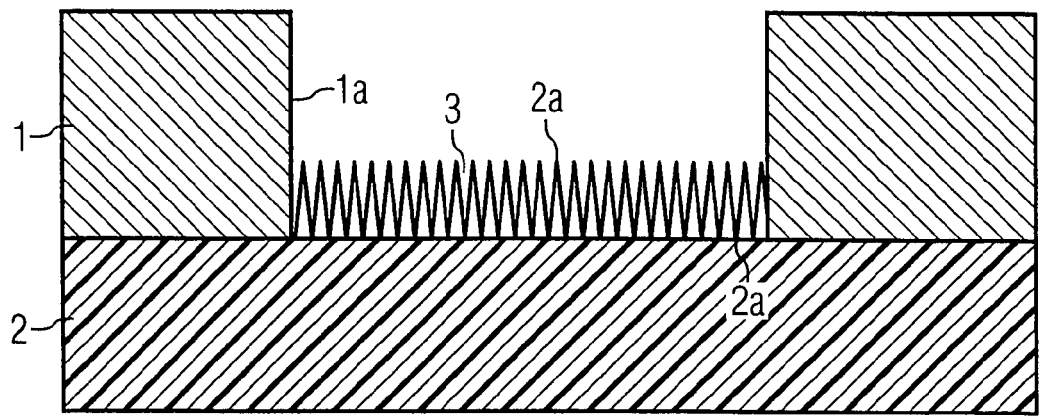
FIG. 1 shows a semiconductor substrate with the structure of non-metallic surfaces according to the invention.

As is shown in FIG. 1, the non-metallic surface (2a) which is intended to be in contact with the molding compound has a structure (3) which increases the adhesion between the non-metallic surface (2a) and the molding compound. In this embodiment, the irregularities (3) are shown as depressions in the layer (2) which was deposited on the non-metallic surface (2a).

Figure 2:
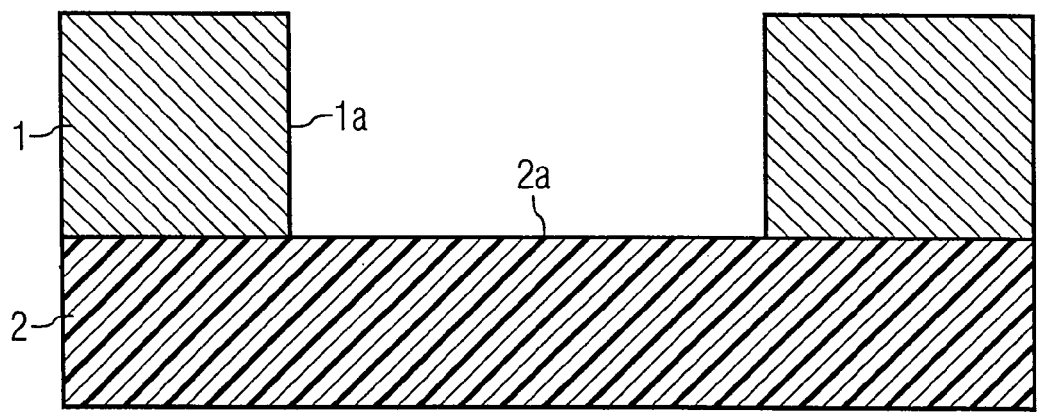
FIG. 2 shows a semiconductor substrate before the treatment according to the invention.

FIG. 2 shows a semiconductor substrate before the treatment according to the invention. In this embodiment, the non-metallic surface (2a) is changed to the structure according to the invention just by anisotropic plasma etching. Particles whose size is in the nanometer range are sputtered off during the anisotropic plasma etching, are deposited on the adjacent non-metallic surfaces, and mask the rest of the plasma etching at these points.

Figure 3:
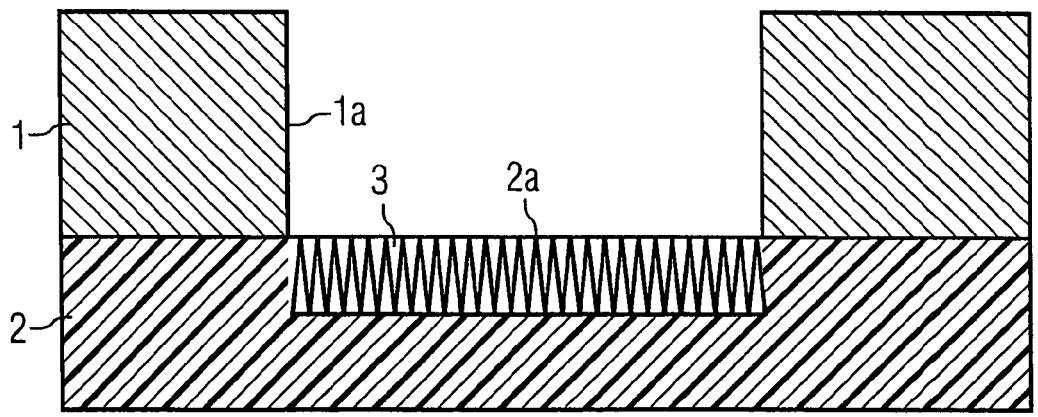
FIG. 3 shows one particular embodiment of a semiconductor substrate after the treatment according to the invention.

FIG. 3 shows the result after the treatment according to the invention, based on use of the substrate as shown in FIG. 2.

Figure 4:
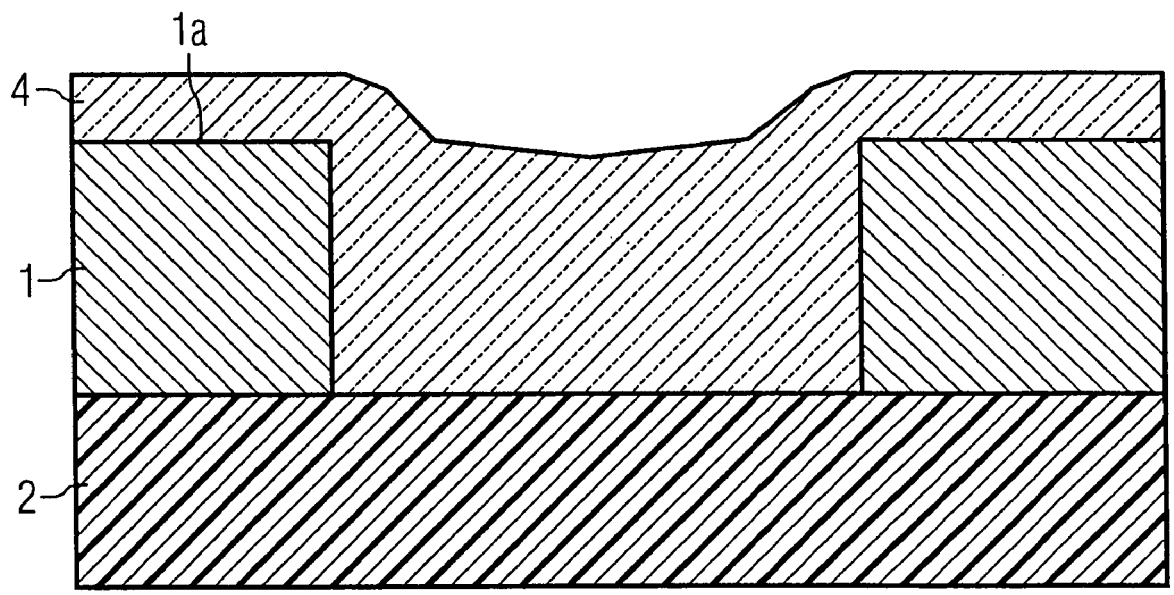
FIGS. 4 and 5 show one particular embodiment for achieving the structure according to the invention.
Figure 5:
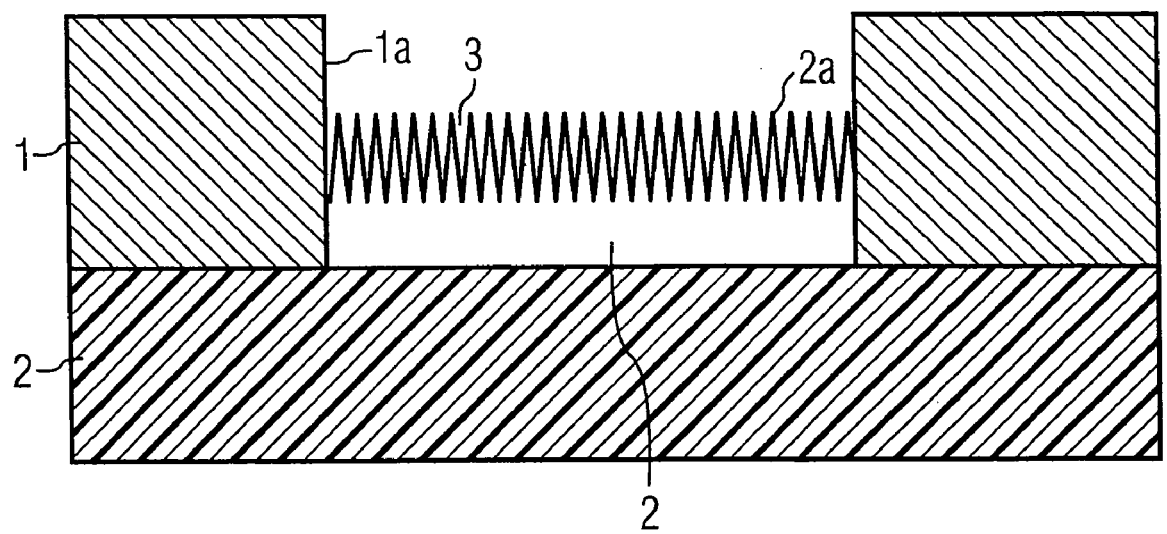

In FIG. 4, an oxide layer (4) has been deposited over the last metallization plane, so that this oxide layer (4) has a planarizing effect so that greater deposited layer thicknesses are achieved in the areas between the metallization than on the metallization itself. This oxide layer (4) can, for example, be achieved by spin-on-glass, with corresponding bottom layers and cap layers, or by high-density deposition. The process then continues with the treatment as described in FIGS. 2 and 3. FIG. 5 illustrates the result of a treatment such as this.

Figure 6:
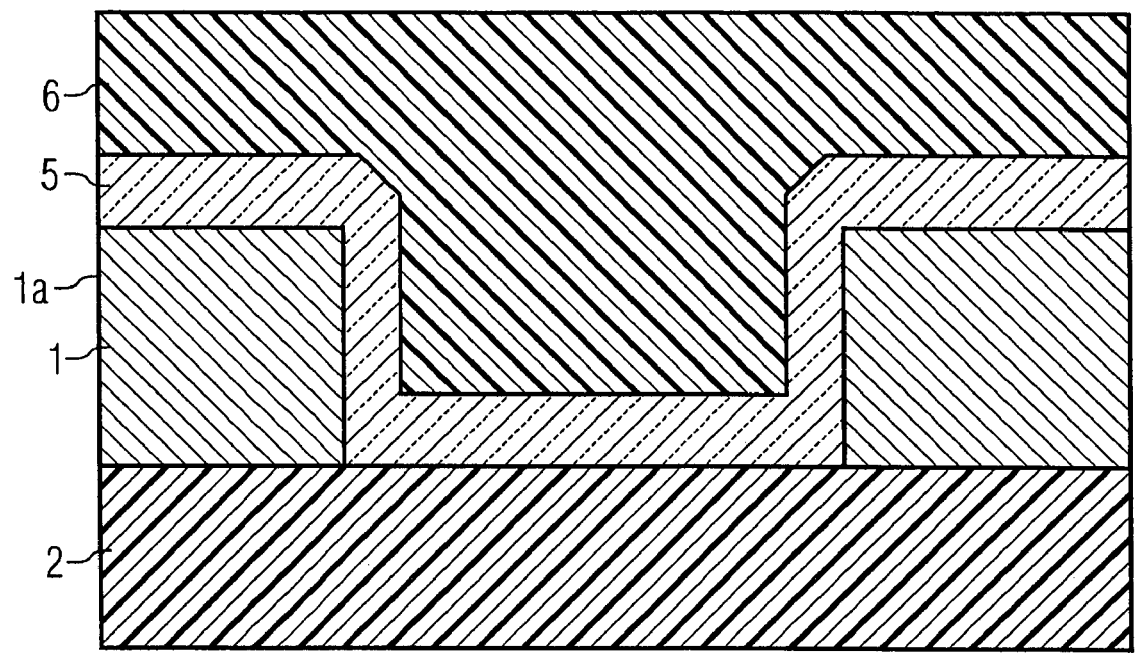
FIGS. 6 and 7 show a further embodiment for achieving the structure according to the invention.
Figure 7:
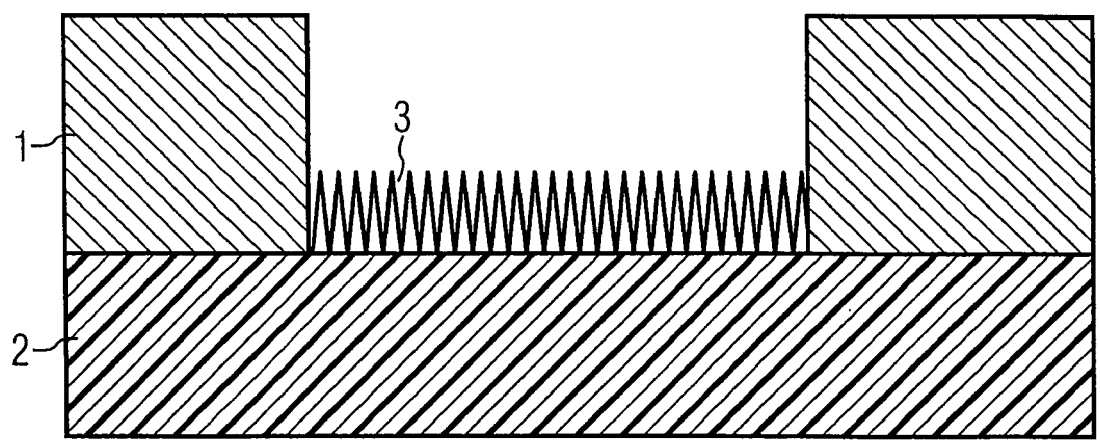

A further embodiment is described in FIG. 6, specifically deposition of an essentially conformal oxide layer (5), which, for example, is composed of silane oxide or TEOS, and which is deposited over the last metallization plane. A varnish (6) is then applied, which has a planarizing effect, so that the structure according to the invention can be achieved by subsequently etching back the varnish and the oxide, by means of plasma etching.

LIST OF REFERENCE SYMBOLS

1 Metal
1a Metal surface
2 Non-metal
2a Non-metallic surface
3 Irregularities in the non-metallic surface
4 Spin-on-glass layer
5 Oxide layer
6 Varnish layer

The invention claimed is:

1. A semiconductor element with metallic and non-metallic surfaces configured to be coupled to a molding compound, at least one of the non-metallic surfaces having a surface layer thereon, the surface layer having a plurality of irregularities in order to increase adhesion between at least one non-metallic surface and the molding compound, wherein adjacent ones of the plurality of irregularities are spaced apart by approximately 1 to 30 nanometers, and each of the plurality of irregularities has a depth of between 10 and 80 nanometers.

2. The semiconductor element as claimed in claim 1, wherein the plurality of irregularities are in the form of pointed depressions.

3. The semiconductor element as claimed in claim 1, wherein adjacent ones of the plurality of irregularities are spaced apart by approximately 2 and 10 nanometers.

4. The semiconductor element as claimed in claim 1, wherein each of the plurality of irregularities has a depth of between 15 and 40 nanometers.

5. The semiconductor element as claimed in claim 1, wherein at least some of the plurality of irregularities are in the form of holes.

6. The semiconductor element as claimed in claim 1, wherein the plurality of irregularities form a stamped pattern.

7. The semiconductor element as claimed in claim 1, wherein the surface layer forms a part of at least one non-metallic surface.

8. The semiconductor element as claimed in claim 1, wherein the surface layer is in the form of a separate layer on at least one non-metallic surface.

9. A semiconductor element having metallic surfaces and non-metallic surfaces configured to attach to a molding compound, at least one non-metallic surface having a roughened surface to increase the adhesion between the non-metallic surface and the molding compound, wherein
the roughened surface includes a nominal surface and a plurality of features, each of the plurality of features including at least one point vertically displaced from the nominal surface,
adjacent ones of the plurality of features are displaced by a distance of between 1 and 30 nanometers, and
the at least one point vertically displaced form the nominal surface is vertically displaced from the nominal surface by 10 and 80 nanometers.

10. The semiconductor element of claim 9, wherein adjacent ones of the plurality of features are displaced by a distance of between 2 and 10 nanometers.

11. The semiconductor element as claimed in claim 9, wherein each of the plurality of irregularities has a depth of between 15 and 40 nanometers.

12. The semiconductor element as claimed in claim 9, wherein at least some of the plurality of irregularities are in the form of holes.

13. The semiconductor element as claimed in claim 9, wherein the plurality of irregularities form a stamped pattern.

14. The semiconductor element as claimed in claim 9, wherein the surface layer forms a part of at least one non-metallic surface.

15. The semiconductor element as claimed in claim 9, wherein the surface layer is in the form of a separate layer on at least one non-metallic surface.

* * * * *